(12) United States Patent
Tertinek et al.

(10) Patent No.: US 9,438,259 B2
(45) Date of Patent: Sep. 6, 2016

(54) CIRCUIT, AN INTEGRATED CIRCUIT, A TRANSMITTER, A RECEIVER, A TRANSCEIVER, A METHOD FOR GENERATING A PROCESSED OSCILLATOR SIGNAL, AN APPARATUS FOR GENERATING A PROCESSED OSCILLATOR SIGNAL, AND SOFTWARE-RELATED IMPLEMENTATIONS

(71) Applicant: Intel IP Corporation, Santa Clara, CA (US)

(72) Inventors: Stefan Tertinek, Linz (AT); Peter Preyler, Weyer (AT); Thomas Mayer, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/832,342

(22) Filed: Aug. 21, 2015

(65) Prior Publication Data
US 2016/0094237 A1    Mar. 31, 2016

(30) Foreign Application Priority Data
Sep. 26, 2014    (DE) .................. 10 2014 113 951

(51) Int. Cl.
*H03M 1/06*    (2006.01)
*H03M 1/10*    (2006.01)
*H03M 1/82*    (2006.01)

(52) U.S. Cl.
CPC .............. *H03M 1/10* (2013.01); *H03M 1/82* (2013.01)

(58) Field of Classification Search
CPC ......... H03M 1/82; H03M 1/10; H04L 27/36; H03F 3/245; H03F 3/2175

USPC ........ 341/118, 166, 144; 375/296, 371, 298, 375/112
See application file for complete search history.

(56) References Cited

U.S. PATENT DOCUMENTS

| | | | |
|---|---|---|---|
| 5,061,928 | A | 10/1991 | Karema et al. |
| 5,068,661 | A | 11/1991 | Kaneaki et al. |
| 5,424,739 | A | 6/1995 | Norsworthy et al. |
| 7,009,539 | B2 | 3/2006 | Okuda et al. |
| 7,626,525 | B2 | 12/2009 | Zhou et al. |
| 8,994,573 | B2 | 3/2015 | Henzler et al. |
| 9,054,925 | B1 | 6/2015 | Madoglio et al. |

(Continued)

FOREIGN PATENT DOCUMENTS

DE    102013113495    6/2015

OTHER PUBLICATIONS

Taiwalkar, Sumit. "Quantization Error Spectra Structure of a DTC Synthesizer via the DFT Axis Scaling Property." IEEE Transactions on Circuits and Systems—I: Regular Papers, vol. 59, No. 6, Jun. 2012, pp. 1242-1250.

Vaidyanathan, P.P. "Multirate Digital Filters, Filter Banks, Polyphase Networks, and Applications: A Tutorial." Proceedings of the IEEE, vol. 78, No. 1, Jan. 1990. pp. 56-93.

Madoglio, Paolo et al. "A 2.5-GHz, 6.9-mW, 45-nm-LP CMOS, Delta Sigma Modulator Based on Standard Cell Design With Time-Interleaving." IEEE Journal of Solid-State Circuits, vol. 45, No. 7, Jul. 2010, pp. 1410-1420.

(Continued)

*Primary Examiner* — Lam T Mai
(74) *Attorney, Agent, or Firm* — Eschweiler & Associates, LLC

(57) ABSTRACT

A circuit according to an example includes a digital-to-time converter configured to receive an oscillator signal and to generate a processed oscillator signal based on the received oscillator signal in response to a control signal, and a time-interleaved control circuit configured to generate the control signal based on a time-interleaved technique.

21 Claims, 7 Drawing Sheets

(56) References Cited

U.S. PATENT DOCUMENTS

| | | | |
|---|---|---|---|
| 2003/0062948 A1* | 4/2003 | Notani | H02M 3/07 327/544 |
| 2014/0266822 A1* | 9/2014 | Henzler | G04F 10/005 341/118 |
| 2015/0036767 A1* | 2/2015 | Degani | H04L 27/36 375/298 |
| 2015/0280724 A1 | 10/2015 | Menkhoff et al. | |
| 2015/0381214 A1* | 12/2015 | Tertinek | H04B 1/0082 455/208 |

OTHER PUBLICATIONS

Non Final Office Action Dated Mar. 22, 2016 U.S. Appl. No. 14/630,953.

Notice of Allowance Dated May 6, 2016 U.S. Appl. No. 14/630,953.

* cited by examiner

CIRCUIT, AN INTEGRATED CIRCUIT, A TRANSMITTER, A RECEIVER, A TRANSCEIVER, A METHOD FOR GENERATING A PROCESSED OSCILLATOR SIGNAL, AN APPARATUS FOR GENERATING A PROCESSED OSCILLATOR SIGNAL, AND SOFTWARE-RELATED IMPLEMENTATIONS

CROSS REFERENCE TO RELATED APPLICATIONS

This application claims priority to German Application number 102014113951.8, filed on Sep. 26, 2014, the contents of which are herein incorporated by reference in its entirety.

FIELD

The present disclosure relates to a circuit, an integrated circuit, a transmitter, a receiver, a transceiver, a method for generating a processed oscillator signal, an apparatus for generating a processed oscillator signal and corresponding software-related implementations.

BACKGROUND

In many transmitter, receiver or transceiver applications, a local oscillator (LO) signal is used, for instance, for up-mixing or down-mixing a signal to be transmitted or received, respectively. In many of these applications, different transmission techniques, for instance different radio-based transmission techniques, are used to transmit, receive or exchange data. For instance, mobile devices operating in a cellular network may not only communicate inside the specific network, but also transmit, receive or exchange data using other, only locally available radio-based transmission access points.

In some of these applications, the different transmission technologies available may even be used simultaneously, for instance, to transmit, receive or exchange data, for synchronizing calendars, notes or other pieces of information, while at the same time programs, applications or other data may be downloaded from a server. Moreover, in the case of cellular phones, during transmitting, receiving or exchanging data, telephone conversations may be held.

Since many of these different transmission technologies operate in different frequency bands or at different wavelengths, several local oscillator signals may have to be provided having different frequencies, sometimes even at the same time. Implementing several oscillator circuits providing different local oscillator signals simultaneously may cause unwanted coupling effects and may result in comparably large and complex implementations. DTC-based (DTC=digital-to-time converter) implementations may be used, which may rely on a smaller number of oscillator circuits. However, with increasing operation frequencies, the complexity and accuracy of control circuits for controlling the digital-to-time converters may become more complex due to the higher operation frequencies necessary to operate them.

SUMMARY

Therefore, a demand exists to simplify a corresponding DTC-based implementation.

This demand may be satisfied by a circuit, an integrated circuit, a transmitter, a receiver, a transceiver, a method for generating a processed oscillator signal, an apparatus for generating a processed oscillator signal or a software-related implementation according to any of the independent claims.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
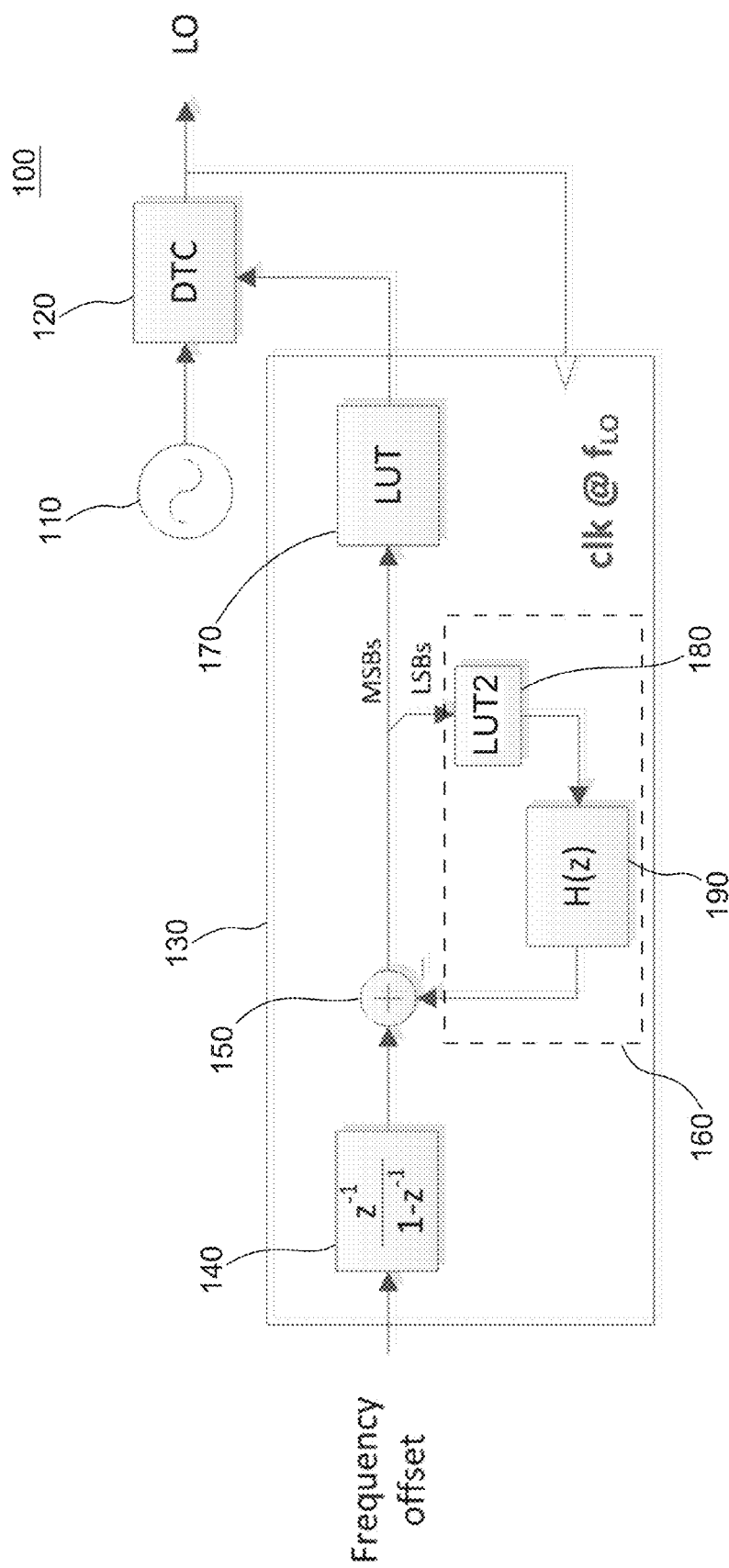
FIG. 1 shows a block diagram of a DTC-based local oscillator signal generator.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In many fields of our daily lives, the access to information, the availability of transmitting data or exchanging data or communicating in general with another person or a computer-based system becomes more and more important. For instance, the availability of accessing the internet, e-mails or other communication systems becomes more and more of a natural part of our lives, which is used for both personal and business applications. Moreover, also in other fields of our modern society, the availability of data and the possibility of communicating with other individuals, groups of individuals or computer-based systems play an important role.

While in the past most of the communication was cable-bound, wireless communication systems become more and more available and an everyday asset. For instance, mobile computing devices including, for instance, laptop computers, notebooks, tablet computers, personal data assistants, smartphones and cellphones, to name a few examples, provide the availability to access data or to communicate with other devices using wireless communication technologies. Other examples include peripheral devices such as headsets, cars, printers, scanners and other devices often allowing obtaining or even exchanging data by using wireless communication schemes. Many of these wireless communication schemes and technologies are radio-based including, for instance, examples such as first, second, third, fourth or fifth generation cellular communication technologies, but also non-cellular based radio-based technologies, which may allow access to an access point from a closer vicinity only. Examples include, for instance, near-field communication (NFC), RFID-based access to data (RFID=radio-frequency identification) and wireless local area network (WLAN) access technologies.

In many of these technologies and schemes but also in other communication schemes including, for instance, cable-bound transmission schemes, the data to be transmitted are modulated onto a local oscillator (LO) signal. In other technologies, a local oscillator signal may be used in an unmodulated way, for instance, to provide a clocking signal, a common time basis or for other purposes.

In many applications, not only a single communication technology is employed, but the corresponding device may be able to communicate with other devices or systems using more than just a single transmission technology. Often, these different technologies are based on different frequency ranges, which may require providing more than one local oscillator signal having, for instance, different frequencies. Since some devices may be capable of operating and transmitting, receiving and/or exchanging data and other information using different technologies simultaneously, it may even be necessary to provide the different local oscillator signals at the same time.

Although in the following applications based on radio-frequency (RF) signals will be described, which may be used for transmitting, receiving or exchanging data using a radio-based transmission technologies, examples are by far not restricted to this field of application.

The generation of modulated and/or unmodulated radio-frequency carrier signals may be based on digital-to-time converters (DTCs), which are becoming a more and more attractive implementation for providing different local oscillator signals. For instance, in the case of digital-intensive solutions for multi-standard RF-based transmitters, receivers or transceivers, multiple local oscillator signals may be provided or generated by a single radio-frequency oscillator circuit driving multiple DTCs. An oscillator circuit may be implemented, for instance, by using phase-locked-loop technology (PLL technology) such that in the previously-mentioned digital-intensive applications, a single radio-frequency digital PLL (RF-DPLL) may be used to drive more than one DTC. Such a solution may be area-efficient.

When the corresponding oscillator comprising a single reference oscillator comprising magnetically active components such as coils, inductances or the like, and yet drive more than one PLL or digital PLL (DPLL), it may even be possible to reduce or even avoid magnetic coupling issues present in contemporary multiple DPLL solutions comprising more than just one reference oscillator.

To illustrate this, FIG. 1 shows a simplified block diagram of a circuit 100 capable of generating a local oscillator (LO) signal. The circuit 100 comprises an oscillator 110 coupled to a digital-to-time converter 120 (DTC), which receives from the oscillator 110 an oscillator signal. The DTC 120 generates at an output a processed oscillator signal based on the oscillator signal received from the oscillator 110 in response to a control signal received by a control circuit 130. The processed oscillator signal as generated or provided by the DTC 120 may be used, for instance, as a local oscillator (LO) signal.

The DTC 120 may generate the processed signal to comprise a predetermined phase relationship with respect to the oscillator signal generated by the oscillator 110. The predetermined relationship may be determined by the control signal as provided by the control circuit 130. For instance, the DTC 120 may act as a delay circuit to delay an edge of the oscillator signal by an amount of time determined by the control signal as provided by the control circuit 130.

Although all examples and circuits described here may equally well be implemented based on analog signals having an essentially continuous range of values and having an essentially continuous resolution over time, in the following, examples will be described in which the oscillator signal as well as the processed oscillator signal will be a digital signal assuming essentially two or more discrete signal levels. The discrete signal levels may be equally spaced or may follow another quantization rule, for instance, a logarithmic quantization in the case of more than two signal levels being implemented. In between, the oscillator signal or the processed oscillator signal assuming another signal level, the oscillator signal or the processed oscillator signal may comprise an edge or transition.

By suitably controlling the DTC 120, it may be possible to alter the frequency of the oscillator signal as generated by the oscillator 110. In this case, the processed oscillator signal as generated by the DTC 120 may comprise a frequency different from the frequency of the oscillator signal provided by the oscillator 110.

To control the frequency of the processed signal, the control circuit 130 may be provided with a frequency offset signal, which may, for instance, be a constant or a quasi-constant signal. The frequency offset signal may be provided to an integrator 140 indicated in FIG. 1 by "$z^{-1}/(1-z^{-1})$". The integrator 140 provides at an output a phase ramp signal, which may be provided to an optional adder 150, which may be implemented in context with an optional noise shaper or noise shaping circuit 160. The noise shaper 160 may be configured to generate a dither signal, which is superimposed with the phase ramp signal generated by the integrator 140. Here, the dither signal is subtracted from the phase ramp signal by the adder 150. The phase ramp signal in its superimposed form may then be fed back to the noise shaping circuit 160 in full or only partially. For instance, as indicated in FIG. 1, only a part of a digital representation of the phase ramp signal 150 may be fed back to an input of the noise shaping circuit 160 such that the signal fed back may, for instance, comprise the least significant bit or the least significant bits (LSBs).

Since the DTC 120 may not be fully linear, it may be advisable to implement a correction circuit 170, which may, for instance, comprise a look-up table (LUT) to modify the phase ramp signal to obtain the control signal for the DTC 120. Optionally, the correction circuit 170 may only be provided with a part of the phase ramp signal provided by the integrator 140 optionally in its superimposed form. For instance, a digital representation of the phase ramp signal received and processed by the correction circuit 170 may comprise a lower number of bits than the total number of the digital representation of the phase ramp signal. The data provided by the correction circuit 170 may be based on a successional number of bits comprising the most significant bit of the most significant bits (MSBs).

The noise shaping circuit 160 may optionally comprise a further correction circuit 180 coupled to the integrator 150 to receive the phase ramp signal in its superimposed form. The further correction circuit 180 may be configured to correct non-linearities of the DTC 120 similar to the correction circuit 170. Accordingly, the further correction circuit 180 may comprise a second look-up table (LUT2) as indicated in FIG. 1.

The further correction circuit 180 may be coupled to a filter 190, which implements a filter function H(z) used to perform the noise shaping on the phase ramp signal. To be a little more precise, in the example depicted in FIG. 1, the filter 190 generates the dither signal, which is then superimposed with the phase ramp signal provided by the integrator 140.

In the example of the digital control block for the DTC-based local oscillator generation depicted in FIG. 1, the desired local oscillator frequency is generated by applying a code ramp in the form of the control signal to input of the DTC 120. The code ramp or phase ramp signal is obtained by integrating the constant digital word indicating the frequency offset (frequency offset signal). The noise shaping circuit 160 may be used to shape the DTC quantization noise to frequencies, where spectral mask requirements may be relaxed. In the example depicted here, the look-up table of the correction circuit 170 and a similar error table in the form of the second look-up table of the further correction circuit 180 may be used to correct for DTC non-linearities.

In the example depicted here, the processed oscillator signal or, in other words, the local oscillator signal, is fed back to the control circuit 130 to clock the control circuit 130, as indicated in FIG. 1 by "clk @ $f_{LO}$". In other words, the control circuit 130 is clocked at the frequency $f_{LO}$ of the local oscillator. As a consequence, the input of the DTC 120 is updated also at the rate of the local oscillator. Using a lower rate may violate spectral mask requirement since large signal images may occur, when the updates are performed at a lower rate.

When the desired local oscillator frequency $f_{LO}$ becomes larger, the digital control block of a DTC 120 for the local oscillator generation as depicted in FIG. 1 may require the control circuit 130 to be also operated at the corresponding higher frequency. For instance, when the desired local oscillator frequency is in the multi-Gigahertz (multi-GHz) range, the control circuit 130 may need to be designed in high-speed custom digital logic, which may require circuit optimizations and careful layout designs to meet the timing requirements or other parameters. Applications with frequencies in the multi-Gigahertz range come, for instance, from LTE mid-bands, where the local oscillator is in the range between 2 and 3 GHz. Under these conditions, even pipelining may represent a significant challenge at these high frequencies, particularly when using low-leakage processes. As a consequence, the design of the digital control circuit 130 may add significant effort and risk to the overall DTC system design.

As will be outlined in more detail below, using a circuit according to an example may help to relax timing requirements so that the digital block or control circuit may be implemented in standard cells and designed using automated place-and-route techniques, which may be used in radio-frequency digital synthesis.

A basic principle of examples is generating the digital control signal for the digital-to-converter in a time-interleaved manner. This may allow relaxing the timing requirements. A time-interleaved architecture may be obtained by decomposing the digital signal processing blocks into their polyphase components or circuits. However, the components may be interconnected or cross-coupled. However, the components may be clocked at a lower rate than the rate of the intended processed oscillator signal or, in other words, lower than the local oscillator rate. Yet, the digital input of the digital-to-time converter may be updated at the higher frequency of the processed oscillator signal or, in other words, at the local oscillator rate by sequentially selecting the polyphase component in the proper phase.

Figure 2:
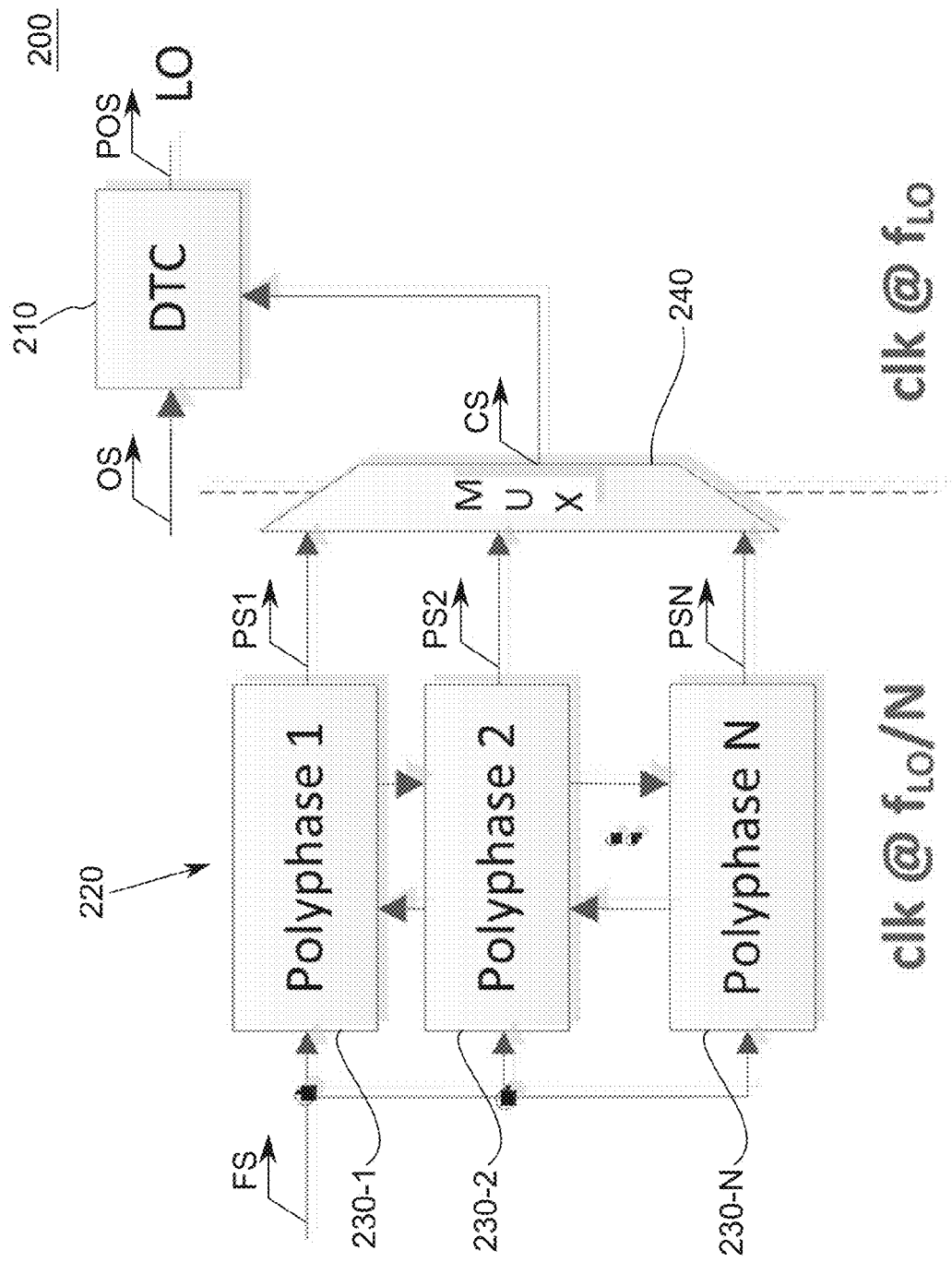
FIG. 2 shows a simplified block diagram of an example of a circuit comprising a digital-to-time converter and a time-interleaved control circuit.

FIG. 2 shows a simplified block diagram of a circuit 200 according to an example. As described in the context of FIG. 1, the circuit 200 comprises a digital-to-time converter 210 (DTC) and a time-interleaved control circuit 220. The control circuit 220 is configured to generate a control signal CS to the DTC 210 based on a time-interleaved technique. The DTC 210 is configured to receive an oscillator signal OS and to generate a processed oscillator signal POS based on the received oscillator signal OS in response to the control signal CS. The processed signal may, for instance, be used as a local oscillator (LO) signal.

The DTC 120 may cause the oscillator signal OS being delayed by an amount of time specified by the control signal CS as explained in the context of FIG. 1. Therefore, in response to the control signal CS, the processed oscillator signal POS and the oscillator signal OS comprise a predetermined phase relationship with respect to each other. By changing the control signal CS, the phase relation between the processed oscillator signal POS and the oscillator signal OS may be changed.

An important aspect of the example of the circuit 200 as depicted in FIG. 2 is to generate the digital control signal CS for the DTC 210 in a time-interleaved manner allowing to operate the control circuit 220 at a rate lower than the frequency of the processed oscillator signal PS or, in other words, of the local oscillator frequency $f_{LO}$. In the example depicted in FIG. 2, the control circuit 220 is configured to receive a frequency offset signal FS and to generate a plurality of N polyphase signals PS1, . . . , PSN each corresponding to a phase shift with respect to the processed oscillator signal POS. To allow the control circuit 220 to generate the polyphase signals PSn with n being an integer in the range between 1 and N, the control circuit 220 comprises a plurality of N at least partially cross-coupled polyphase circuits 230-1, . . . , 230-N. Each of the polyphase circuits 230 is configured to generate a polyphase signal PSn.

The control circuit 220 is further configured to generate the control signal CS by combining the polyphase signals PSn in the proper phase. To do this, the control circuit 220 further comprises a multiplexer 240 configured to combine the polyphase signals PSn by multiplexing the polyphase signals PSn in the proper phase to generate the control signal CS. As a consequence, it may be possible to operate the multiplexer with the frequency of the processed output signal POS or, in other words, the local oscillator frequency $f_{LO}$ as indicated in FIG. 2 by "clk @ $f_{LO}$", while the rest of the control circuit 220, especially the polyphase circuits 230 operate at a lower frequency of $f_{LO}/N$ as also indicated in FIG. 2 ("clk @ $f_{LO}/N$"). As a consequence, it is possible for the control circuit 220 to operate in terms of the polyphase circuits 230 at a rate of the frequency of the local oscillator $f_{LO}$ divided by the number N of polyphase components used for interleaving. Nevertheless, to avoid the previously mentioned violations of spectral mask requirements, the phase of the DTC 210 may be updated at the full rate of the frequency of the local oscillator $f_{LO}$ as required. The control circuit 220, which may be implemented as a fully digital circuit, decomposes the N polyphase components to process the polyphase components by the individual polyphase circuits 230. Nevertheless, the components or polyphase circuits 230 may be interconnected or cross-coupled with one another and are clocked at the lower rate $f_{LO}/N$. The multiplexer 240 selects the components in a sequential manner at the rate of the local oscillator $f_{LO}$ updating the DTC phase at the rate of the local oscillator.

In the following an implementation for time-interleaved DTC control based on polyphase components will be described for the case of a two-component time-interleaved example, but can be easily extended to more components at more general digital signal processing blocks.

The polyphase decomposition may in principle be performed based on an arbitrary filter function H(z). For instance, starting based on the filter function a. $H(z) = \Sigma_{n=-\infty}^{\infty} h(n) z^{-n}$, (1)

a N-fold polyphase decomposition may be written as b. $H(z) = \Sigma_{k=0}^{N-1} z^{-k} F_k(z^N)$. (2)

$F_k(z)$ are referred to as the polyphase components and can be expressed based on the filter function H(z) of Equation (1) as c. $F_k(z) = \Sigma_{n=-\infty}^{\infty} E_k(n) z^{-n}$. (3)

Each of the addends of Equation (2) represents one of the polyphase components, which have to be selected by the multiplexer 240 in the right phase, so that the polyphase components $F_k(z)$ form the corresponding filter function H(z).

The polyphase components $F_k(z)$ depend, as Equation (3) shows, on filter coefficients $E_k(n)$ which may be expressed in terms of the filter coefficients h(n) of the original filter function H(z) by i. $E_k(n) = h(Nn+k)$. (4)

Each of these filter coefficients $E_k(n)$ may be implemented as an individual filter element in a circuit. These filter elements may, for instance, adjust the signal strength by multiplying the corresponding value of the signal by the specified coefficient as defined by Equation (4). Along with delay elements corresponding to the z-terms, the polyphase components $F_k(z)$ may therefore be implemented as a filter.

In a more straightforward approach for generating a local oscillator signal based on the circuit 100 of FIG. 1, the outputs of two or more identical integrators 140 to two or more identical noise shaping circuits 160 and adders 150 as well as corresponding correction circuits 170, which run in parallel, may be connected. Although it may be possible to clock the adders 150, the noise shaping circuits 160 and the correction circuits 170 at a lower rate than that of a local oscillator, for instance, in the case of two parallel noise shaping circuits 160, adders 150 and correction circuits 170 at half the rate of the local oscillator, the integrator 140 still needs to run at the full local oscillator rate. Furthermore, running two identical noise shaping circuits 160 in parallel may yield a different noise transfer function than running one noise shaping circuit at the full rate as indicated in FIG. 1. This may complicate not only the system specification but also the implementation.

In contrast, as will be laid out in more detail below, in a circuit 200 according to an example, the entire digital control block or control circuit 220 comprising an integrator, a noise-shaping circuit and a correction circuit may be clocked at the corresponding lower rate compared to the rate of the local oscillator. For instance, in the case of a two-fold polyphase decomposition, these components may be clocked at half the rate of the local oscillator. This may save not only power and chip area, but may also allow implementing the same noise transfer function. In other words, the noise transfer function may be implemented unchanged.

Figure 3:
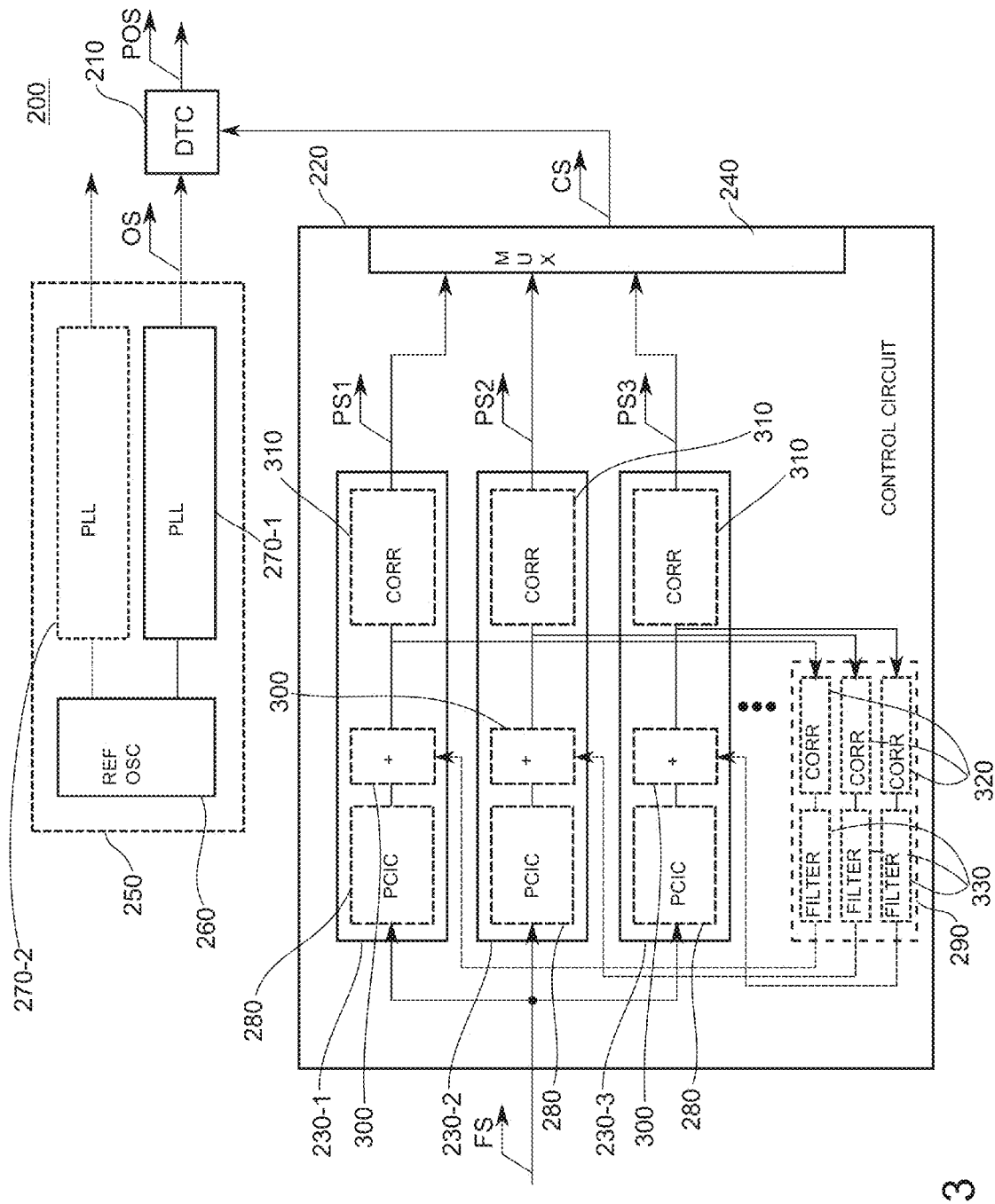
FIG. 3 shows a block diagram of a further example of a circuit comprising a digital-to-time converter and a time-interleaved control circuit.

FIG. 3 shows a more detailed block diagram of a circuit 200 according to an example. As mentioned before, the circuit 200 once again comprises a digital-to-time converter 210 as well as a control circuit 220. The control circuit 220 once again comprises a plurality of polyphase circuits 230, which are configured to receive the previously-mentioned frequency offset signal FS. Again the polyphase circuits 230 generate polyphase signals PSn with n being an integer in the range between 1 and N, which are provided to a multiplexer 240, which in turn combines the polyphase signals PSn to obtain the control signal by multiplexing. The control signal CS is then provided to the DTC 210.

For the sake of simplicity only, the possible cross-couplings between the polyphase circuits 230 have been omitted. Naturally, as indicated earlier, the polyphase circuits 230 may be cross-coupled.

In contrast to the block diagram of FIG. 2, the block diagram of FIG. 3 also shows an oscillator 250, which comprises a single reference oscillator circuit 260 and one or more phase-locked loop (PLL) circuits 270. Of all the PLL circuits 270 are coupled to the reference oscillator circuit 260 to receive a reference clock signal based on which the PLL circuits 270 provide one or more oscillator signals OS.

The oscillator 250 may therefore be configured to generate a plurality of oscillator signals OS comprising, for instance, different frequencies or the like. The PLL circuits 270 may be implemented as digital PLL circuits 270 (DPLL).

All the PLL circuits 270 are driven by a single reference oscillator circuit 260. By reducing the number of reference oscillator circuits 260, it may be possible to reduce an area necessary to implement a circuit 200, to reduce the power consumption of the circuit 200 and to allow a more stable operation. For instance, the reference oscillator circuit 260 may comprise magnetically active components such as coils, inductances or the like, so that implementing more than a single reference oscillator circuit 260 may cause the different reference oscillator circuits to magnetically influence one another. By implementing a single reference oscillator circuit 260 driving a single PLL circuit 270 or a the plurality of PLL circuits 270, this source of disturbances may be eliminated, leading to less disturbed oscillator signals.

The reference oscillator circuit 260 may, for instance, comprise a voltage controlled oscillator (VCO), a digitally controlled oscillator (DCO) or another controllable oscillator circuits. These circuits may, for instance, be coupled to a crystal oscillator circuit, which may be compensated or stabilized, for instance, with reference to temperature or other environmental and/or operational parameters.

As described before, the DTC 210 is then capable and configured to process the oscillator signal OS to generate the processed oscillator signal POS based on the control signal as provided by the control circuit 220.

While the multiplexer 240 may still operate at the frequency of the processed output signal POS, the polyphase circuits 230 may operate at a lower operation frequency, for instance, equal to the frequency of the processed oscillator signal POS divided by the number N of polyphase circuits 230 and, hence, by the number of polyphase components used in the control circuit 220.

Each of the polyphase circuits 230 may comprise a polyphase component integrator circuit, which are configured to receive the frequency offset signal FS and to integrate the received frequency offset signal to generate a plurality of polyphase component phase ramp signals. The plurality of the polyphase component integrator circuits 280 form an integrator similar to the integrator 140 of FIG. 1 configured to integrate the frequency offset signal FS.

The control circuit 220 further comprises a time-interleaved noise shaping circuit 290 configured to generate a plurality of polyphase component dither signals, which are provided to a plurality of adders comprised in the polyphase circuits 230 and coupled to the polyphase component integrator circuits 280 to superimpose the polyphase component dither signals with the polyphase component phase ramp signals. As described in context with FIG. 1, the outputs of the adders 300 are coupled to the noise shaping circuit 290 to close the feedback loop for noise shaping and to polyphase correction circuits 310 also comprised in their respective polyphase circuits 230. Once again the polyphase component correction circuits 310 may comprise a look-up table or another technique to correct the superimposed polyphase component phase ramp signals for non-linearities of the DTC 210.

In the example depicted in FIG. 3, the correction circuits 310 of the polyphase circuits 230 receive the phase ramp signals in their superimposed form. In other words, they receive the phase ramp signals after being superimposed with a plurality of polyphase component dither signals generated by the noise shaping circuit 290, which also operates in a time-interleaved manner. However, in other examples, it is by far not necessary to implement a noise shaping circuit 290 and, hence, the corresponding adders 300 of the polyphase circuits 230. In this case, the correction circuits 310, which are optional components by themselves, may receive the phase ramp signals generated by the integrator circuits 280 in an un-superimposed form.

As described in context with FIG. 1, the noise shaping circuits 290 also comprise further polyphase component correction circuits also to correct non-linearities of the DTC 210 in the received polyphase component phase ramp signals. These further correction circuits 320 may also comprise a look-up table comprising data to correct the received phase ramp signals based on calibration data of the DTC 210. Furthermore, the noise shaping circuit 290 comprises a corresponding number of polyphase component filters 330, which implement the filter function used for noise shaping the polyphase component phase ramp signals as described above.

However, since the noise shaping circuit 290 is also a time-interleaved noise shaping circuit 290, it comprises a corresponding number of further correction circuits 320 and filters 330 for each of the polyphase components. Correspondingly, the further polyphase component correction circuits 320 together form a correction circuit capable of and configured to correct the received polyphase decomposition of the resulting phase ramp signal for non-linearities of the DTC 210. Similarly, the individual polyphase component filters 330 form a feedback filter used for noise shaping the phase ramp signal.

It should be noted that in FIG. 3, once again for the sake of simplicity only, the possible cross-couplings between the different components, for instance of the polyphase component filters 330 have been omitted. This is, however, only done for clarity reasons.

Both, the further correction circuits 320 and the polyphase component filters 330 represent optional components, which are by far not required to be implemented even if a corresponding noise shaping circuit 290 is implemented.

Although with respect to the Equations (1) to (4) in principle all polyphase decompositions can be performed, including implementing an integrator, which may be considered as a special form of filter, with respect to FIG. 4, a possible implementation of a two-fold polyphase component time-interleaved circuit 200 will be described in more detail with respect to the block diagram shown in FIG. 4.

Figure 4:
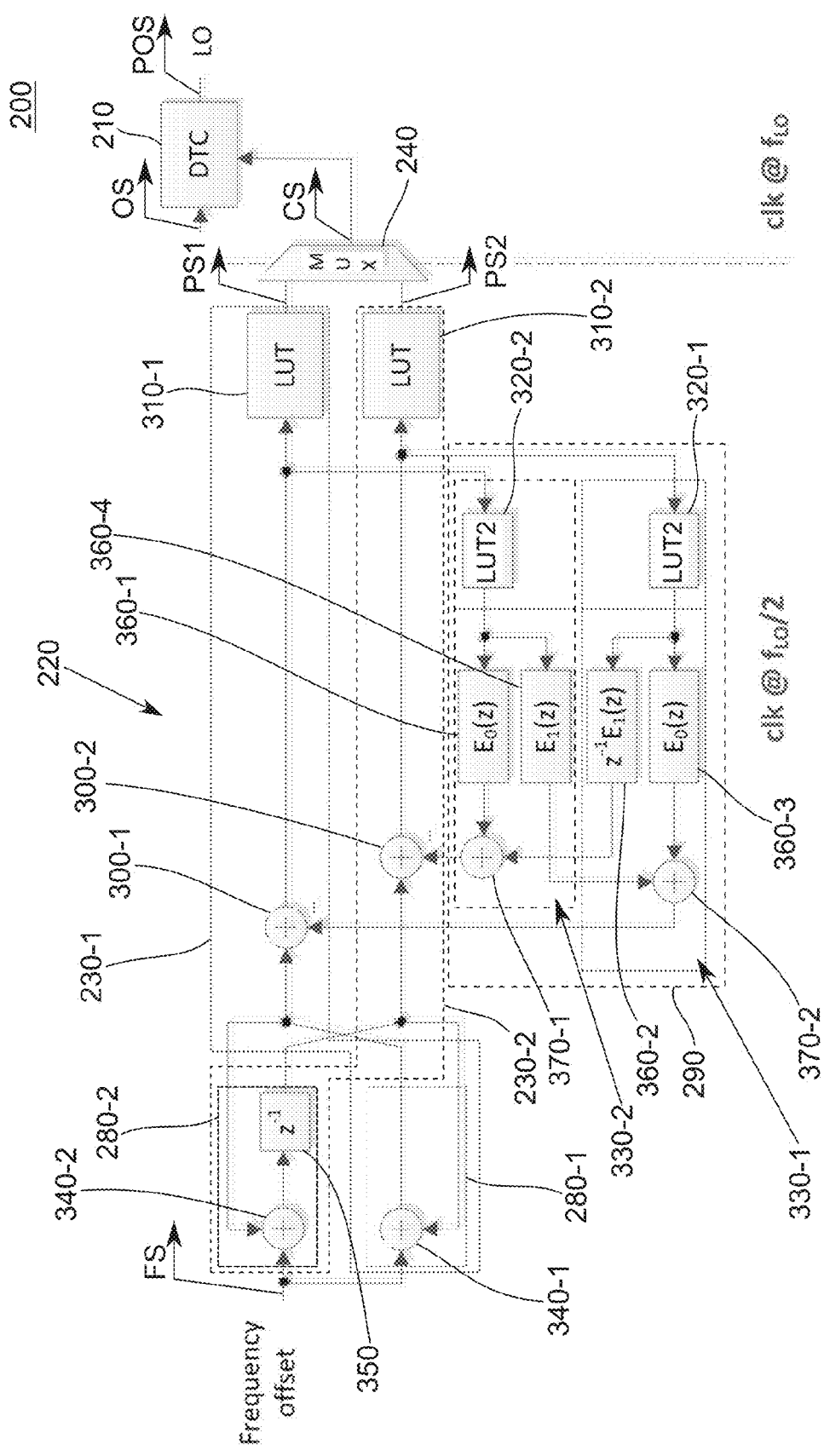
FIG. 4 shows a more detailed block diagram of an example of a circuit comprising a digital-to-time converter and a time-interleaved control circuit comprising N=2 polyphase circuits.

FIG. 4 shows a block diagram of a circuit 200 according to an example, which resembles, with respect to its basic layout, the block diagram of FIG. 2. The circuit 200 differs from the one shown in FIG. 2 with respect to the number N of polyphase components. While in the example depicted in FIG. 2 the number of components is N, the circuit 200 of FIG. 4 shows a two-fold polyphase component circuit 200 or, in other words, a circuit 200 with N=2 polyphase components. Accordingly, the circuit 200 comprises two polyphase circuits 230-1, 230-2, which are configured to receive the frequency offset signal FS and to generate corresponding first and second polyphase signals PS1, PS2, respectively. The multiplexer 240 combines the two polyphase signals PS1, PS2 to generate the control signal CS, which is provided to the DTC 210 to control the delay of the processed oscillator signal POS with respect to the oscillator signal OS provided to the DTC 210.

As depicted in FIG. 3, also the circuit 200 shown in FIG. 4 comprises polyphase component integrator circuits 280-1, 280-2, which are comprised in the first and second polyphase circuits 230-1, 230-2, respectively. It should be noted that due to the layout of the block diagram shown in FIG. 4, the second integrator circuit 230-2 is depicted above the first integrator circuit 280-1, although the rest of the polyphase circuits 230-1, 230-2 are shown in the reverse arrangement. The first polyphase component integrator circuit 280-1 is configured to generate a first polyphase component phase ramp signal, while the second polyphase component integrated circuit 280-2 is configured to generate, correspondingly, a second polyphase component phase ramp signal. The first polyphase component integrator circuit comprises an adder 340-1, which is configured to add the received frequency offset signal FS to the second polyphase component phase ramp signal generated by the second integrator circuit 280-2. Here, the second integrator circuit 280-2 may be directly coupled to the adder 340-1 of the first integer circuit 280-1 to receive the second polyphase component phase ramp signal.

The second integrator circuit 280-2 comprises an adder 340-2 configured to direct the received frequency offset signal FS to the first polyphase component phase ramp signal. It further comprises a delay circuit 350, which is configured to delay an output of the adder 340-2 of the second integrator circuit 280-2 by one clock cycle of the frequency of the polyphase circuits. The delay circuit 350 generates the second polyphase component phase ramp signal. The delay circuit may, for instance, be implemented as a flip-flop or another corresponding circuit. The first polyphase component integrator circuit 280-1 is once again directly coupled to the delay circuit 350 of the second polyphase component integrator circuit 280-2 to receive the first polyphase component phase ramp signal.

As indicated in FIG. 4, the first integrator circuit 280-1 is part of the first polyphase circuit 230-1, while the second integrator circuit 280-2 is part of the second polyphase circuit 230-2.

The two integrator circuits 280-1, 280-2 show how the integrator 140 of the circuit 100 in FIG. 1 can be decomposed into its two-fold polyphase components. Since the input of the integrator circuits 280-1, 280-2 is a constant or quasi-constant signal comprising, for instance, the frequency offset signal for the DCT 210, the input of both adders 340-1, 340-2 is the same. As a consequence, in the implementation here, input delays and down-samplers can be omitted. Here, due to the constant or quasi-constant input, the two adders 340-1, 340-2 and the delay element 350 may be both running at half the rate $f_{LO}/2$ of the frequency $f_{LO}$ of the local oscillator (LO) or—in other words—of the processed oscillator signal POS.

The two integrator circuits 280 generate the time-interleaved code ramp at the inputs of the multiplexer 240. The inputs of the multiplexer 240 are selected alternately at the full rate $f_{LO}$ of the local oscillator signal. As a consequence, the entire code ramp is recovered at an output of the multiplexer 240, which forms the control signal CS to be fed to the DTC 210.

Likewise, also a noise shaping filter can be decomposed into its two polyphase components. The noise shaping of the polyphase component phase ramp signal generated by the two integrator circuits 280-1, 280-2 may be done by applying the corresponding filter with a noise shaper transfer function H(z) and corresponding impulse responses h(n). Based on the Equations (1) to (4) for the special case of N=2, the transfer function may be written as d. $H(z) = F_0(z^2) + z^{-1} F_1(z^2)$.   (5)

Here $F_0(z)$ is the transfer function of the sequence h(2n) and $F_1(z)$ is the transfer function of the sequence h(2n+1) as also indicated by Equations (3) and (4). Equation (5) represents the transfer function H(z) at the full rate as the two transfer functions $F_0(z)$ and $F_1(z)$ at the half rate. For example, when h(n)=[1 ¼ ⅛ ¹⁄₁₆], the transfer function $F_0(z)$ or h(2n) corresponds to [1 ⅛] and $F_1(z)$ or h(2n+1) corresponds to [¼ ¹⁄₁₆].

By interconnecting the polyphase decompositions, the time-interleaved digital control block or control circuit 220 as depicted in FIG. 4 can be implemented. Accordingly, the first and second polyphase circuits 230-1, 230-2, respectively, comprise adders 300-1, 300-2, respectively, as well as a time-interleaved noise shaping circuit 290. Similar to the circuit 200 shown in FIG. 3, the noise shaping circuit 290 also comprises for the first polyphase circuit 230 a first polyphase component filter 330-1 and, for the second polyphase circuit 230-2, a second polyphase component filter 330-2. The two polyphase component filters 330-1, 330-2 are coupled to the adders 300-1, 300-2, respectively, to superimpose the polyphase component dither signals generated by the filters 330 with the phase ramp signals generated by the integrator circuits 280-1, 280-2, respectively. Here, the dither signals are subtracted from the corresponding phase ramp signals.

As will be described below, the polyphase component filters 330 are also in this implementation at least partially, to be a little more exact, here even fully cross-coupled.

The first polyphase component filter 330-1 is configured to generate a first filter signal, while the second polyphase component filter 330-2 is configured to generate a second filter signal, which is generated by a first polyphase filter element 360-1 of the second polyphase component filter 330-2. Both, the first and second filter signals are then provided to a first adder 370-1 of the second polyphase component filter 330-2, which combines the two filter signals to provide or generate a second polyphase component dither signal to the adder 300-2 of the second polyphase circuits 230-2. In the example depicted here, the first filter signal is generated by a second polyphase filter element 360-2 of the first polyphase component filter 330-1.

The first polyphase component filter 330-1 is further configured to generate a third filter signal generated by a third polyphase filter element 360-3, while the second polyphase component filter 330-2 is configured to generate a fourth filter signal, which is generated by a fourth polyphase filter element 360-4 of the second polyphase component filter 330-2. Both, the third and fourth filter signals are then provided to a second adder 370-2 of the first polyphase component filter 330-1, which combines the two filter signals to provide or generate a first polyphase component dither signal to the adder 300-1 of the first polyphase circuit 230-1.

In the example depicted here, polyphase component filter functions of the first and third polyphase filter elements 360-1, 360-3, respectively, are substantially equal. Both filter elements 360-1, 360-3 represent a multiplication with a factor $E_0(z)$, as given by Equation (4). The polyphase component filter function of the second filter element 360-2 essentially corresponds to a concatenation of a delay ($z^{-1}$) and the polyphase component filter function $E_1(z)$ of the fourth filter element 360-4. Hence, the filter function of the fourth filter element 360-4 is substantially equal to $E_1(z)$ according to Equation (4), while the filter function of the second filter element 360-2 is substantially equal to $z^{-1} E_1(z)$ according to Equations (3) and (4).

As described in context with the circuit 200 of FIG. 3, the noise shaping circuit 290 is coupled to the first and second polyphase circuits 230-1, 230-2 behind the adders 300-1, 300-2 to receive the phase ramp signals. As a consequence, the noise shaping circuit 290 receives the polyphase component phase ramp signals in the superimposed form or, in other words, after being superimposed with their corresponding polyphase component dither signals.

To counteract non-linearities of the DTC 210, the noise shaping circuit 290 comprises further polyphase component correction circuits 320-1, 320-2, which are coupled to the first and second polyphase circuits 230-1, 230-2, respectively. As described before, the further polyphase component correction circuit 320 may comprise a look-up table LUT2, which may comprise data to take non-linearities of the DTC 210 at least partially into account. The data comprised in the look-up tables of the two further polyphase component correction circuits 320 may be based on calibration data of the DTC 210.

The outputs of the further polyphase correction circuits 320-1, 320-2 are then coupled to the inputs of the first and second polyphase component filters 330-1, 330-2, respectively. However, the correction circuits 320 as well as the filters 330 represent optional components, which may or may not be implemented along with the adders 300 of the polyphase circuits 230.

To not only correct non-linearities of the DTC 210 in terms of the noise shaping circuit 290, but also with respect to the polyphase phase ramp signals, the polyphase circuits 230-1, 230-2 further comprise a polyphase component correction circuit 310-1, 310-2, respectively. Also, the correction circuits 310 may comprise a look-up table, may comprise calibration data of the DTC 210 to at least partially counteract effects of non-linearities of the DTC 210.

Optionally, the correction circuits 310 may be configured to use a digital representation of the corresponding polyphase component phase ramp signals comprising the most significant bits, while the digital representation of the further polyphase correction circuits 320 accepts the least significant bits of a corresponding digital representation. This optional implementation may reflect the fact that the noise shaping circuit 290 may be mainly concerned with correcting quantization errors which are more dominant in the lower significant bits, while the actual phase ramp is determined by the more significant bits of the corresponding digital representation. Therefore, the control signal CS and the polyphase signals PS1, PS2 may be generated based on the most significant bits.

In the example of a time-interleaved digital control for the DTC-based local oscillator generation shown in FIG. 4, two look-up tables and two error tables (LUT2) of the further correction circuits 320 may be used to correct non-linearity errors for both time-interleaved branches. However, here the polyphase circuits 230 and, hence, the entire digital block apart from the multiplexer 240 is running at the frequency $f_{LO}/2$.

The multiplexer inputs are then selected alternatively at the rate $f_{LO}$ so that the phase shifts of the DTC210 are still generated at the local oscillator rate. Although the implementation shown in FIG. 4 may require more adders compared to a solution in which the entire block is running at the full local oscillator rate, it may still be possible to relax timing constraints and, hence, simplify manufacturing of a corresponding control circuit 220.

Circuits 200 may be used for DTC-based RF (RF=radio-frequency) carrier generation for unmodulated or modulated applications. Circuits 200 may be attractive for applications with multimode radio frequencies, since this may lift the need to implement several PLL circuits and/or digitally-controlled oscillator circuits (DCO circuit) on a chip. For instance, in a DTC-based system, it may be possible by implementing a circuit 200 according to an example to save chip area for products, with, for instance, ten or even more DCO coils.

Figure 5:
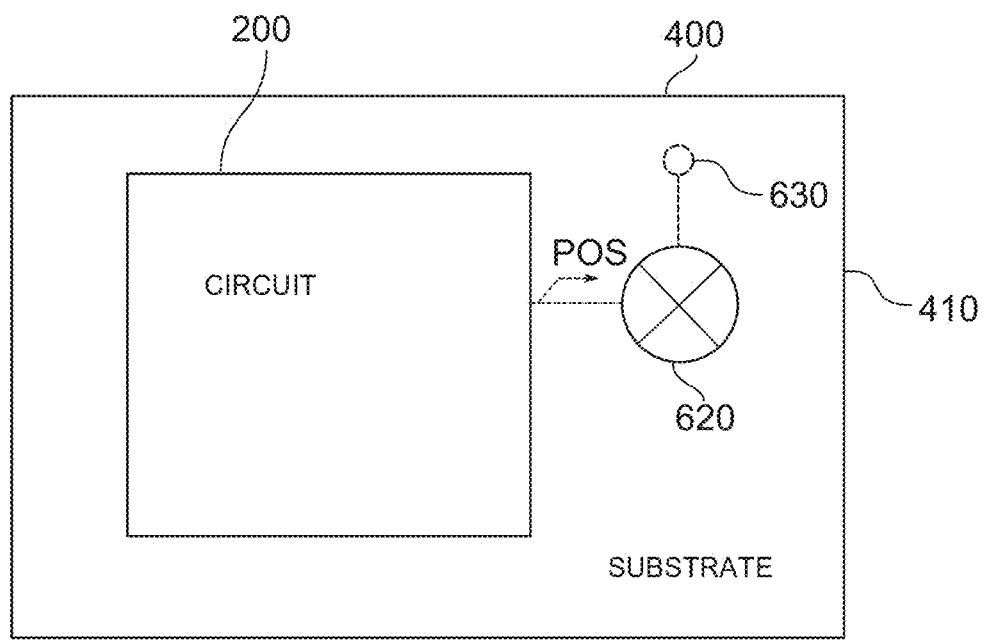
FIG. 5 shows a simplified block diagram of an example of an integrated circuit.

FIG. 5 shows a simplified block diagram of an integrated circuit 400 comprising a substrate 410 which may be a semiconductor die. The substrate 410 comprises a circuit 200 as explained before, the output of which is coupled to a mixer 420. The output of the circuit 200, at which the processed oscillator signal POS is available, can be used as a local oscillator (LO) signal for up-mixing or down-mixing another signal by the mixer 420. A terminal 430 may also be coupled to the multiplexer 420 to provide the signal to be down-mixed to the mixer 420 or to obtain the up-mixed signal from the mixer 420 and, for instance, to couple the integrated circuit 400 to an antenna.

Naturally, FIG. 5 only shows an example of an integrated circuit 400. Circuits 200 according to examples may also be used in other non-wireless communication systems related application scenarios.

Figure 6:
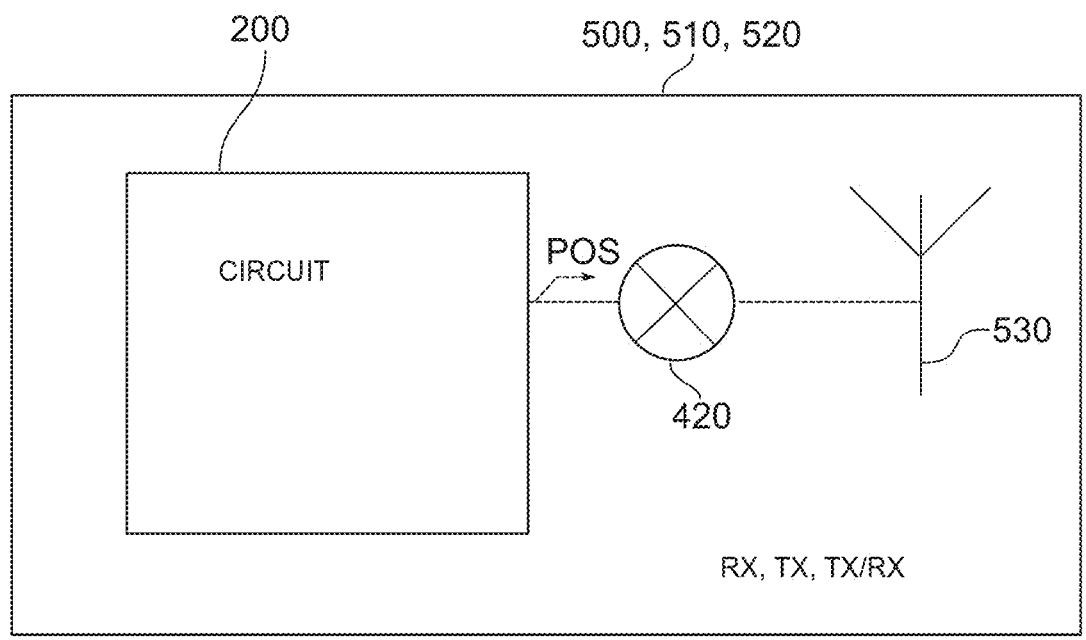
FIG. 6 shows a simplified block diagram of an example of a receiver, a transmitter or a transceiver.

FIG. 6 shows a simplified block diagram of a receiver 500, a transmitter 510 or a transceiver 520, which comprises a circuit 200 as described before. At an output of the circuit a mixer 420 may be coupled to receive the processed oscillator signal POS. Moreover, the mixer 420 may be coupled to an antenna 530 to receive or to provide a signal to be processed by the mixer 420 or to transmit a processed signal processed by the mixer 420, respectively.

Naturally, a circuit 200 may also be used in other fields of applications concerning a receiver, a transmitter or a transceiver. Therefore, implementing the circuit 200 in the context of a mixer 420 is by far not necessary.

Figure 7:
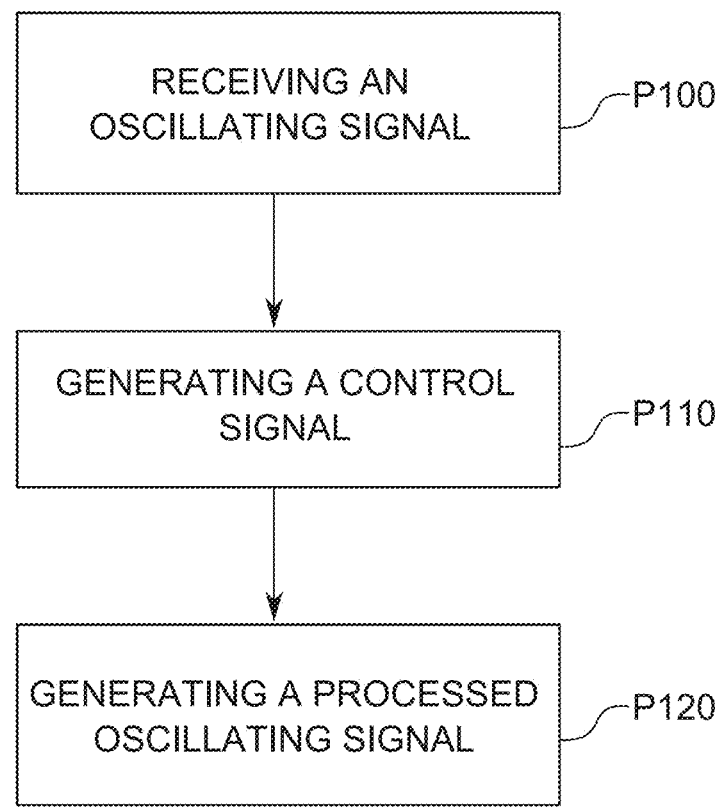
FIG. 7 shows a flowchart of a method for generating a processed oscillator signal based on an oscillator signal.

FIG. 7 shows a flowchart of a method according to an example for generating a processed oscillator signal POS based on an oscillator signal OS. In a process P100 the oscillator signal OS is received. In a process P110, a control signal CS is generated based on a time-interleaved technique. In a process P120 the processed oscillator signal POS is generated by using a DTC 210 delaying the received oscillator signal OS in response to the control signal CS.

The processes are by far not required to be performed in the indicated order of FIG. 7. The processes may be performed in an arbitrary order, timely overlapping or even simultaneously. Naturally, the processes may also be performed several times, for instance in the form of a loop.

In the following examples pertain to further examples.

Example 1 is a circuit comprising a digital-to-time converter configured to receive an oscillator signal and to generate a processed oscillator signal based on the received oscillator signal in response to a control signal, and a time-interleaved control circuit configured to generate the control signal based on a time-interleaved technique.

In example 2, the subject matter of example 1 may optionally include the control circuit being configured to receive a frequency offset signal and to generate a plurality of polyphase signals, each polyphase signal corresponding to a phase shift with respect to the processed oscillator signal, wherein the control circuit is further configured to generate the control signal by combining the polyphase signals in the proper phase.

In example 3, the subject matter of any of the examples 1 or 2 may optionally include the control circuit being a fully digital circuit.

In example 4, the subject matter of any of the examples 1 to 3 may optionally include the control circuit comprising a plurality of at least partially cross-coupled polyphase circuits, each polyphase circuit being configured to generate a polyphase signal, and wherein the control circuit further comprises a multiplexer configured to combine the polyphase signals by multiplexing the plurality of polyphase signals to generate the control signal in the proper phase.

In example 5, the subject matter of example 4 may optionally include the multiplexer being configured to operate at a frequency of the processed oscillator signal, and wherein the plurality of the polyphase circuits is configured to operate at a frequency lower than the frequency of the processed oscillator signal.

In example 6, the subject matter of example 5 may optionally include the plurality of the polyphase circuits being configured to operate at a frequency being equal to the frequency of the processed oscillator signal divided by a total number of the polyphase circuits of the plurality of polyphase circuits.

In example 7, the subject matter of any of the examples 1 to 6 may optionally include the plurality of polyphase circuits comprising a plurality of polyphase component integrator circuits configured to receive a frequency offset signal and to integrate the received frequency offset signal to generate a plurality of polyphase component phase ramp signals, wherein the plurality of polyphase component integrator circuits form an integrator configured to integrate the frequency offset signal.

In example 8, the subject matter of example 7 may optionally include the plurality of polyphase component integrator circuits comprising a first polyphase component integrator circuit configured to generate a first polyphase component phase ramp signal of the plurality of polyphase component phase ramp signals and a second polyphase component integrator circuit configured to generate a second polyphase component phase ramp signal of the plurality of polyphase component phase ramp signals, wherein the first polyphase component integrator circuit comprises an adder configured to add the received frequency offset signal to the second polyphase component phase ramp signal.

In example 9, the subject matter of example 8 may optionally include the second polyphase component integrator circuit being directly coupled to the adder of the first polyphase component integrator circuit to receive the second polyphase component phase ramp signal.

In example 10, the subject matter of any of the examples 8 or 9 may optionally include the second polyphase component integrator circuit comprising an adder configured to add the received frequency offset signal to the first polyphase component phase ramp signal and a delay circuit to configured to delay an output of the adder of the second polyphase component integrator circuit by one clock cycle of a frequency of the polyphase circuits, wherein the delay circuit is configured to generate the second polyphase component phase ramp signal.

In example 11, the subject matter of example 10 may optionally include the first polyphase component integrator circuit being directly coupled to the adder of the second polyphase component integrator circuit to receive the first polyphase component phase ramp signal.

In example 12, the subject matter of any of the examples 8 to 11 may optionally include a first polyphase circuit of the plurality of polyphase circuits comprising the first polyphase component integrator circuit, and wherein a second polyphase circuit of the plurality of polyphase circuits comprises the second polyphase component integrator circuit.

In example 13, the subject matter of any of the examples 2 to 12 may optionally include the control circuit being configured to process a constant or quasi-constant frequency offset signal.

In example 14, the subject matter of any of the examples 7 to 13 may optionally include the plurality of polyphase circuits comprising a plurality of polyphase component correction circuits coupled to the plurality of polyphase component integrator circuits, wherein the plurality of polyphase component correction circuits is configured to receive the polyphase component phase ramp signals and to adjust the received polyphase component phase ramp signals to obtain the plurality of polyphase signals, wherein the plurality of polyphase component correction circuits is configured to correct non-linearities of the digital-to-time converter.

In example 15, the subject matter of example 14 may optionally include the plurality of polyphase component correction circuits comprising at least one look-up-table comprising data to correct the received polyphase component phase ramp signals based on calibration data of the digital-to-time converter.

In example 16, the subject matter of any of the examples 14 or 15 may optionally include the plurality of polyphase component correction circuits being configured to adjust the received polyphase component phase ramp signals to obtain the plurality of polyphase signals based on a successional number of bits of a digital representation of the received polyphase component phase ramp signals comprising the most significant bit, wherein the number of bits is smaller than an over-all number of bits of the digital representation.

In example 17, the subject matter of any of the examples 7 to 16 may optionally include the control circuit further comprising a time-interleaved noise shaping circuit configured to generate a plurality of polyphase component dither signals, and wherein the plurality of polyphase circuits further comprise a plurality of adders coupled to the plurality of polyphase component integrator circuits and configured to superimpose the plurality of polyphase component phase ramp signals with the plurality of polyphase component dither signals.

In example 18, the subject matter of example 18 may optionally include the time-interleaved noise shaping circuit being configured to operate at the frequency of the polyphase circuits.

In example 19, the subject matter of any of the examples 17 or 18 may optionally include the plurality of further polyphase component correction circuits being configured to process the received polyphase component phase ramp signals based on a successional number of bits of a digital representation of the received polyphase component phase ramp signals comprising the least significant bit, wherein the number of bits is smaller than an over-all number of bits of the digital representation.

In example 20, the subject matter of any of the examples 17 to 19 may optionally include the time-interleaved noise shaping circuit being configured to receive the plurality of polyphase component phase ramp signals in the superimposed form and to generate the plurality of polyphase component dither signals based on the received polyphase component phase ramp signals in the superimposed form.

In example 21, the subject matter of example 20 may optionally include 21 the time-interleaved noise shaping circuit comprising a plurality of polyphase component noise shaping circuits configured to generate the plurality of polyphase component dither signals, wherein the plurality of polyphase component noise shaping circuits form a noise shaper.

In example 22, the subject matter of example 21 may optionally include 22 the plurality of polyphase component noise shaping circuits comprising a plurality of polyphase component filters, wherein the plurality of polyphase component filters form a noise shaping filter, wherein the plurality of polyphase component filters is configured to generate the plurality of polyphase component dither signals.

In example 23, the subject matter of example 22 may optionally include the plurality of polyphase component filters being at least partially cross-coupled.

In example 24, the subject matter of any of the examples 22 or 23 may optionally include a first polyphase component filter of the plurality of polyphase component filters being configured to generate a first filter signal, wherein a second polyphase component filter of the plurality of polyphase component filters comprises a first polyphase filter element configured to generate a second filter signal, wherein the second polyphase component filter comprises an adder to combine the first filter signal and the second filter signal to obtain a second polyphase component dither signal of the plurality of polyphase component dither signals.

In example 25, the subject matter of example 24 may optionally include the adder of a second polyphase circuit of the plurality of polyphase circuits being configured to superimpose a second polyphase component phase ramp signal of the plurality of polyphase component phase ramp signals with the second polyphase component dither signal.

In example 26, the subject matter of example 25 may optionally include the adder of the second polyphase circuit being configured to superimpose the second polyphase component phase ramp signal with the second polyphase component dither signal by subtracting the second polyphase component dither signal from the second polyphase component phase ramp signal.

In example 27, the subject matter of any of the examples 24 to 26 may optionally include the first polyphase component filter comprising a second polyphase filter element configured to generate the first filter signal.

In example 28, the subject matter of any of the examples 24 to 27 may optionally include the first polyphase component filter further comprising a third polyphase filter element configured to generate a third filter signal, wherein the second polyphase component filter is configured to generate a fourth filter signal, and wherein the first polyphase component filter comprises an adder to combine the third filter signal and the fourth filter signal to obtain a first polyphase component dither signal of the plurality of polyphase component dither signals.

In example 29, the subject matter of example 28 may optionally include the adder of a first polyphase circuit of the plurality of polyphase circuits being configured to superimpose a first polyphase component phase ramp signal of the plurality of polyphase component phase ramp signals with the first polyphase component dither signal.

In example 30, the subject matter of example 29 may optionally include the adder of the first polyphase circuit being configured to superimpose the first polyphase component phase ramp signal with the second polyphase component dither signal by subtracting the first polyphase component dither signal from the first polyphase component phase ramp signal.

In example 31, the subject matter of any of the examples 28 to 30 may optionally include the second polyphase component filter comprising a fourth polyphase filter element configured to generate the fourth polyphase component filter signal.

In example 32, the subject matter of example 31 may optionally include a polyphase component filter function of the first filter element and a polyphase component filter function of the third filter element being essentially identical, and wherein a polyphase component filter function of the second filter element is essentially a concatenation of a polyphase component filter function of the fourth filter element and a delay by one clock cycle of a frequency of the polyphase circuits.

In example 33, the subject matter of any of the examples 22 to 32 may optionally include the plurality of polyphase component noise shaping circuits comprising a plurality of further polyphase component correction circuits configured to receive the plurality of polyphase component phase ramp signals in the superimposed form and to correct non-linearities of the digital-to-time converter in the received polyphase component phase ramp signals.

In example 34, the subject matter of example 33 may optionally include the plurality of further polyphase component correction circuits comprising at least one look-up-table comprising data to correct the received polyphase component phase ramp signals based on calibration data of the digital-to-time converter.

In example 35, the subject matter of any of the examples 1 to 34 may optionally include an oscillator being configured to generate the oscillator signal, wherein the oscillator comprises a phase-locked loop circuit and a single reference oscillator circuit driving the phase-locked loop circuit.

In example 36, the subject matter of example 35 may optionally include the oscillator comprising a single phase-locked loop circuit or a plurality of phase-locked loop circuits driven by the single reference oscillator circuit.

Example 37 is an integrated circuit comprising a digital-to-time converter configured to receive an oscillator signal and to generate a processed oscillator signal based on the received oscillator signal in response to a control signal, and a time-interleaved control circuit configured to generate the control signal based on a time-interleaved technique.

In example 38, the subject matter of example 37 may optionally include a mixer circuit coupled to the circuit to receive the processed oscillator signal of the circuit as a local oscillator signal.

In example 39, the subject matter of example 38 may optionally include the integrated circuit comprising a terminal configured to couple an antenna to the mixer circuit.

Example 40 is a transmitter, a receiver or a transceiver comprising a circuit, the circuit comprising a digital-to-time converter configured to receive an oscillator signal and to generate a processed oscillator signal based on the received oscillator signal in response to a control signal, and a time-interleaved control circuit configured to generate the control signal based on a time-interleaved technique.

In example 41, the subject matter of example 40 may optionally include a mixer circuit coupled to the circuit to receive the processed oscillator signal of the circuit as a local oscillator signal.

In example 42, the subject matter of example 41 may optionally include an antenna coupled to the mixer circuit.

Example 43 is a method for generating a processed oscillator signal based on an oscillator signal, the method comprising receiving the oscillator signal, generating a control signal based on a time-interleaved technique, and generating the processed oscillator signal by using a digital-to-time converter delaying the received oscillator signal in response to the control signal.

In example 44, the subject matter of example 43 may optionally include generating the control signal comprising receiving a frequency offset signal and generating a plurality of polyphase signals, each polyphase signal corresponding to a phase shift with respect to the processed oscillator signal, wherein generating the control signal further comprises generating the control signal by combining the polyphase signals in the proper phase.

In example 45, the subject matter of any of the examples 43 or 44 may optionally include generating the control signal comprising generating a plurality of polyphase signals and multiplexing the plurality of polyphase signals to generate the control signal in the proper phase.

In example 46, the subject matter of any of the examples 43 to 45 may optionally include generating a plurality of polyphase signals comprising receiving a frequency offset signal and integrating the received frequency offset signal to generate a plurality of polyphase component phase ramp signals.

In example 47, the subject matter of any of the examples 44 to 46 may optionally include the frequency offset signal being a constant or quasi-constant frequency offset signal.

In example 48, the subject matter of any of the examples 46 or 47 may optionally include generating the plurality of polyphase signals comprising adjust the polyphase component phase ramp signals to correct non-linearities of the digital-to-time converter.

In example 50, the subject matter of example 48 may optionally include correcting the polyphase component phase ramp signals being based on calibration data of the digital-to-time converter.

In example 50, the subject matter of any of the examples 46 to 49 may optionally include generating a plurality of polyphase signals comprising noise shaping the plurality of polyphase component phase ramp signals.

In example 51, the subject matter of example 50 may optionally include noise shaping the plurality of polyphase component phase ramp signals comprising generating a plurality of polyphase component dither signals and superimposing the plurality of polyphase component dither signals with the polyphase component phase ramp signals.

In example 51, the subject matter of example 51 may optionally include generating the plurality of polyphase component dither signals comprising filtering the plurality of polyphase component phase ramp signals in the superimposed form.

In example 53, the subject matter of any of the examples 51 or 52 may optionally include generating the plurality of polyphase component dither signals comprising correcting non-linearities of the digital-to-time converter in the polyphase component phase ramp signals.

In example 54, the subject matter of any of the examples 43 to 53 may optionally include generating the oscillator signal using a phase-locked loop circuit driven by a single reference oscillator circuit driving the a phase-locked loop circuit.

In example 55, the subject matter of example 54 may optionally include generating the oscillator signal comprising generating a plurality of oscillator signals using a single phase-locked loop circuit or a plurality of phase-locked loop circuits driven by the single reference oscillator circuit.

Example 56 is an apparatus for generating a processed oscillator signal based on an oscillator signal, the apparatus comprising a means for receiving the oscillator signal, a means for generating the processed oscillator signal by using a digital-to-time converter delaying the received oscillator signal in response to a control signal, and a means for generating the control signal based on a time-interleaved technique.

In example 57, the subject matter of example 56 may optionally include the means for generating the control signal comprising a means for receiving a frequency offset signal and a means for generating a plurality of polyphase signals, each polyphase signal corresponding to a phase shift with respect to the processed oscillator signal, wherein the means for generating the control signal further comprises a means for generating the control signal by combining the polyphase signals in the proper phase.

In example 58, the subject matter of any of the examples 56 or 57 may optionally include the means for generating the control signal comprising a means for generating a plurality of polyphase signals and a means for multiplexing the plurality of polyphase signals to generate the control signal in the proper phase.

In example 59, the subject matter of any of the examples 56 to 58 may optionally include the means for generating a plurality of polyphase signals comprising a means for receiving a frequency offset signal and a means for integrating the received frequency offset signal to generate a plurality of polyphase component phase ramp signals.

In example 60, the subject matter of any of the examples 56 to 59 may optionally include the frequency offset signal being a constant or quasi-constant frequency offset signal.

In example 61, the subject matter of any of the examples 56 to 60 may optionally include the means for generating the plurality of polyphase signals comprising a means for adjust the polyphase component phase ramp signals to correct non-linearities of the digital-to-time converter.

In example 62, the subject matter of example 61 may optionally include the means for correcting the polyphase component phase ramp signals being based on calibration data of the digital-to-time converter.

In example 63, the subject matter of any of the examples 56 to 62 may optionally include the means for generating a plurality of polyphase signals comprising a means for noise shaping the plurality of polyphase component phase ramp signals.

In example 64, the subject matter of example 63 may optionally include the means for noise shaping the plurality of polyphase component phase ramp signals comprising a means for generating a plurality of polyphase component dither signals and a means for superimposing the plurality of polyphase component dither signals with the polyphase component phase ramp signals.

In example 65, the subject matter of example 64 may optionally include the means for generating the plurality of polyphase component dither signals comprising a means for filtering the plurality of polyphase component phase ramp signals in the superimposed form.

In example 66, the subject matter of any of the examples 64 or 65 may optionally include the means for generating the plurality of polyphase component dither signals comprising a means for correcting non-linearities of the digital-to-time converter in the polyphase component phase ramp signals.

In example 67, the subject matter of any of the examples 56 to 66 may optionally include a means for generating the oscillator signal comprising a phase-locked loop circuit and a single reference oscillator circuit driving the a phase-locked loop circuit.

In example 68, the subject matter of example 67 may optionally include the means for generating the oscillator signal comprising a single phase-locked loop circuit or a plurality of phase-locked loop circuits driven by the single reference oscillator circuit.

Example 69 is a machine readable storage medium including program code, when executed, to cause a machine to perform the method of any one of the examples 43 to 55.

Example 70 is a machine readable storage including machine readable instructions, when executed, to implement a method or realize an apparatus as described in any pending of the examples.

Example 71 is a computer program having a program code for performing any of the methods of the examples 43 to 55, when the computer program is executed on a computer or processor.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A circuit comprising:
    a digital-to-time converter configured to receive an oscillator signal and to generate a processed oscillator signal based on the received oscillator signal in response to a control signal; and
    a time-interleaved control circuit configured to generate the control signal based on a time-interleaved technique,
    wherein the control circuit is configured to receive a frequency offset signal and to generate a plurality of polyphase signals, each polyphase signal corresponding to a phase shift with respect to the processed oscillator signal, wherein the control circuit is further configured to generate the control signal by combining the polyphase signals in the proper phase.

2. The circuit according to claim 1, wherein the control circuit is a fully digital circuit.

3. A circuit comprising:
    a digital-to-time converter configured to receive an oscillator signal and to generate a processed oscillator signal based on the received oscillator signal in response to a control signal; and a time-interleaved control circuit configured to generate the control signal based on a time-interleaved technique, wherein the control circuit comprises a plurality of at least partially cross-coupled polyphase circuits, each polyphase circuit being configured to generate a polyphase signal, and wherein the control circuit further comprises a multiplexer configured to combine the polyphase signals by multiplexing the plurality of polyphase signals to generate the control signal in the proper phase.

4. The circuit according to claim 3, wherein the multiplexer is configured to operate at a frequency of the processed oscillator signal, and wherein the plurality of the polyphase circuits is configured to operate at a frequency lower than the frequency of the processed oscillator signal.

5. The circuit according to claim 4, wherein the plurality of the polyphase circuits is configured to operate at a frequency being equal to the frequency of the processed oscillator signal divided by a total number of the polyphase circuits of the plurality of polyphase circuits.

6. The circuit according to claim 3, wherein the plurality of polyphase circuits comprises a plurality of polyphase component integrator circuits configured to receive a frequency offset signal and to integrate the received frequency offset signal to generate a plurality of polyphase component phase ramp signals, wherein the plurality of polyphase component integrator circuits form an integrator configured to integrate the frequency offset signal.

7. The circuit according to claim 6, wherein the plurality of polyphase component integrator circuits comprises a first polyphase component integrator circuit configured to generate a first polyphase component phase ramp signal of the plurality of polyphase component phase ramp signals and a second polyphase component integrator circuit configured to generate a second polyphase component phase ramp signal of the plurality of polyphase component phase ramp signals, wherein the first polyphase component integrator circuit comprises an adder configured to add the received frequency offset signal to the second polyphase component phase ramp signal.

8. The circuit according to claim 7, wherein the second polyphase component integrator circuit comprises an adder configured to add the received frequency offset signal to the first polyphase component phase ramp signal and a delay circuit to configured to delay an output of the adder of the second polyphase component integrator circuit by one clock cycle of a frequency of the polyphase circuits, wherein the delay circuit is configured to generate the second polyphase component phase ramp signal.

9. The circuit according to claim 7, wherein a first polyphase circuit of the plurality of polyphase circuits comprises the first polyphase component integrator circuit, and wherein a second polyphase circuit of the plurality of polyphase circuits comprises the second polyphase component integrator circuit.

10. The circuit according to claim 1, wherein the control circuit is configured to process a constant or quasi-constant frequency offset signal.

11. The circuit according to claim 6, wherein the plurality of polyphase circuits comprises a plurality of polyphase component correction circuits coupled to the plurality of polyphase component integrator circuits, wherein the plurality of polyphase component correction circuits is configured to receive the polyphase component phase ramp signals and to adjust the received polyphase component phase ramp signals to obtain the plurality of polyphase signals, wherein the plurality of polyphase component correction circuits is configured to correct non-linearities of the digital-to-time converter.

12. The circuit according to claim 11, wherein the plurality of polyphase component correction circuits comprise at least one look-up-table comprising data to correct the received polyphase component phase ramp signals based on calibration data of the digital-to-time converter.

13. The circuit according to claim 6, wherein the control circuit further comprises a time-interleaved noise shaping circuit configured to generate a plurality of polyphase component dither signals, and wherein the plurality of polyphase circuits further comprise a plurality of adders coupled to the plurality of polyphase component integrator circuits and configured to superimpose the plurality of polyphase component phase ramp signals with the plurality of polyphase component dither signals.

14. The circuit according to claim 13, wherein the time-interleaved noise shaping circuit is configured to receive the plurality of polyphase component phase ramp signals in the superimposed form and to generate the plurality of polyphase component dither signals based on the received polyphase component phase ramp signals in the superimposed form.

15. The circuit according to claim 14, wherein the time-interleaved noise shaping circuit comprises a plurality of polyphase component noise shaping circuits configured to generate the plurality of polyphase component dither signals, wherein the plurality of polyphase component noise shaping circuits form a noise shaper.

16. The circuit according to claim 15, wherein the plurality of polyphase component noise shaping circuits comprise a plurality of polyphase component filters, wherein the plurality of polyphase component filters form a noise shaping filter, wherein the plurality of polyphase component filters is configured to generate the plurality of polyphase component dither signals.

17. The circuit according to claim 16, wherein the plurality of polyphase component noise shaping circuits comprise a plurality of further polyphase component correction circuits configured to receive the plurality of polyphase component phase ramp signals in the superimposed form and to correct non-linearities of the digital-to-time converter in the received polyphase component phase ramp signals.

18. The circuit according to claim 17, wherein the plurality of further polyphase component correction circuits comprises at least one look-up-table comprising data to correct the received polyphase component phase ramp signals based on calibration data of the digital-to-time converter.

19. A circuit comprising:
a digital-to-time converter configured to receive an oscillator signal and to generate a processed oscillator signal based on the received oscillator signal in response to a control signal;
a time-interleaved control circuit configured to generate the control signal based on a time-interleaved technique; and
an oscillator configured to generate the oscillator signal, wherein the oscillator comprises a phase-locked loop circuit and a single reference oscillator circuit driving the phase-locked loop circuit.

20. The circuit according to claim 19, wherein the oscillator comprises a single phase-locked loop circuit or a plurality of phase-locked loop circuits driven by the single reference oscillator circuit.

21. A transmitter, a receiver or a transceiver comprising a circuit, the circuit comprising:
- a digital-to-time converter configured to receive an oscillator signal and to generate a processed oscillator signal based on the received oscillator signal in response to a control signal; and
- a time-interleaved control circuit configured to generate the control signal based on a time-interleaved technique,
- wherein the control circuit is configured to receive a frequency offset signal and to generate a plurality of polyphase signals, each polyphase signal corresponding to a phase shift with respect to the processed oscillator signal, wherein the control circuit is further configured to generate the control signal by combining the polyphase signals in the proper phase.

* * * * *